US011737366B2

(12) United States Patent
Sprentall et al.

(10) Patent No.: US 11,737,366 B2
(45) Date of Patent: Aug. 22, 2023

(54) LAYERED SENSOR APPARATUS AND METHOD OF MAKING SAME

(71) Applicant: Rogers Corporation, Chandler, AZ (US)

(72) Inventors: Karl E. Sprentall, Scottsdale, AZ (US); Trevor Polidore, Somerville, MA (US); Robert Mone, Stoughton, MA (US); Michael Lunt, Scotland, CT (US); William Kwan, Medford, MA (US)

(73) Assignee: ROGERS CORPORATION, Chandler, AZ (US)

( * ) Notice: Subject to any disclaimer, the term of this patent is extended or adjusted under 35 U.S.C. 154(b) by 1246 days.

(21) Appl. No.: 15/903,204

(22) Filed: Feb. 23, 2018

(65) Prior Publication Data
US 2018/0254405 A1   Sep. 6, 2018

Related U.S. Application Data

(60) Provisional application No. 62/465,239, filed on Mar. 1, 2017.

(51) Int. Cl.
*H01L 41/113*   (2006.01)
*H10N 30/30*   (2023.01)
(Continued)

(52) U.S. Cl.
CPC .............. *H10N 30/302* (2023.02); *G01L 1/14* (2013.01); *G01L 1/142* (2013.01); *G01L 1/16* (2013.01);
(Continued)

(58) Field of Classification Search
CPC ....... H01L 41/311; H01L 41/319; H02N 1/04; H02N 1/08
See application file for complete search history.

(56) References Cited

U.S. PATENT DOCUMENTS 3,832,762 A   9/1974 Johnston et al.
4,786,837 A   11/1988 Kalnin et al.
(Continued)

FOREIGN PATENT DOCUMENTS

CN   103197821 B   6/2016
EP   0040969 A2   12/1981
(Continued)

OTHER PUBLICATIONS

Notification of Transmittal of the International Search Report and The Written Opinion of the International Searching Authority, or the Declaration for International Application No. PCT/US2018/019842 which is related to U.S. Appl. No. 15/903,204 ; dated May 2, 2018; 1-22 pages.

(Continued)

*Primary Examiner* — Bryan P Gordon
(74) *Attorney, Agent, or Firm* — Cantor Colburn LLP

(57) ABSTRACT

A sensor apparatus includes a first of a plurality of layers having a top layer, a bottom layer, and at least one intermediate layer having an electrical conductor layer, each of the top layer, the bottom layer, and the at least one intermediate layer is disposed in direct contact with a respective adjacent layer. A second of the plurality of layers is disposed in direct contact with the first plurality of layers such that the bottom layer of the second plurality of layers is disposed in direct contact with the top layer of the first plurality of layers. The first and second plurality of layers are productive of a piezoelectric voltage absent of an external current producing device and in response to being deformed, and are productive of a change in capacitance in response to being deformed.

24 Claims, 5 Drawing Sheets

(51) Int. Cl.

| | |
|---|---|
| *G01L 1/14* | (2006.01) |
| *H02N 1/04* | (2006.01) |
| *G01L 1/16* | (2006.01) |
| *G01L 5/00* | (2006.01) |
| *H02N 1/08* | (2006.01) |
| *H10N 30/50* | (2023.01) |
| *H10N 30/057* | (2023.01) |
| *H10N 30/071* | (2023.01) |
| *H10N 30/079* | (2023.01) |
| *H10N 30/857* | (2023.01) |

(52) U.S. Cl.
CPC .............. *G01L 5/0052* (2013.01); *H02N 1/04* (2013.01); *H02N 1/08* (2013.01); *H10N 30/057* (2023.02); *H10N 30/071* (2023.02); *H10N 30/079* (2023.02); *H10N 30/50* (2023.02); *H10N 30/857* (2023.02)

(56) References Cited

U.S. PATENT DOCUMENTS

| | | |
|---|---|---|
| 5,844,349 A | 12/1998 | Oakley et al. |
| 6,060,756 A | 5/2000 | Machida et al. |
| 6,495,069 B1 | 12/2002 | Lussey et al. |
| 6,646,540 B1 | 11/2003 | Lussey |
| 7,186,356 B2 | 3/2007 | Lussey et al. |
| 7,467,558 B2 | 12/2008 | Fukuda et al. |
| 7,509,869 B2 | 3/2009 | Liu et al. |
| 8,138,560 B2 | 3/2012 | Yamaguchi et al. |
| 8,478,378 B2 | 7/2013 | Lal et al. |
| 8,479,585 B2 | 7/2013 | Shaw-Klein |
| 8,966,997 B2 | 3/2015 | Taylor |
| 9,178,446 B2 | 11/2015 | Wang et al. |
| 2005/0167188 A1 | 8/2005 | Aisenbrey |
| 2013/0082970 A1 | 4/2013 | Frey et al. |
| 2014/0090488 A1 | 4/2014 | Taylor et al. |
| 2014/0218588 A1* | 8/2014 | Ifuku .................... H10N 30/85 348/340 |
| 2014/0260679 A1* | 9/2014 | Baker ...................... G01L 9/02 73/862.68 |
| 2016/0344308 A1* | 11/2016 | Wang ...................... H02N 1/04 |
| 2018/0254405 A1* | 9/2018 | Sprentall .................. G01L 1/16 |

FOREIGN PATENT DOCUMENTS

| | | |
|---|---|---|
| GB | 2229855 A | 11/1989 |
| WO | 2015122996 A1 | 8/2015 |
| WO | 2016001894 A1 | 1/2016 |

OTHER PUBLICATIONS

Shoubhik Gupta et al; Ultra-Thin Silicon Based Piezoelectric Capacitive Tactile Sensor; Procedia Engineering, Elsevier, Amsterdam, NL, vol. 168, Jan. 4, 2017; 662-665 pages.

Karla Mosi et al.; Harvesting Energy Using a Thin Unimorph Prestressed Bender: Geometrical Effects; Journal of Intelligent Material Systems and Structures; vol. 16; Mar. 2005; 249-261.

Carey Reid Merritr; "Electronic textile-based sensors and systems for long-term health monitoring"; Mar. 20, 2008; 1-175 pages.

Ranjan Vepa; "Dynamics of Smart Structures"; Dynamics of Smart Structures; 2010; 1-11 pages.

* cited by examiner

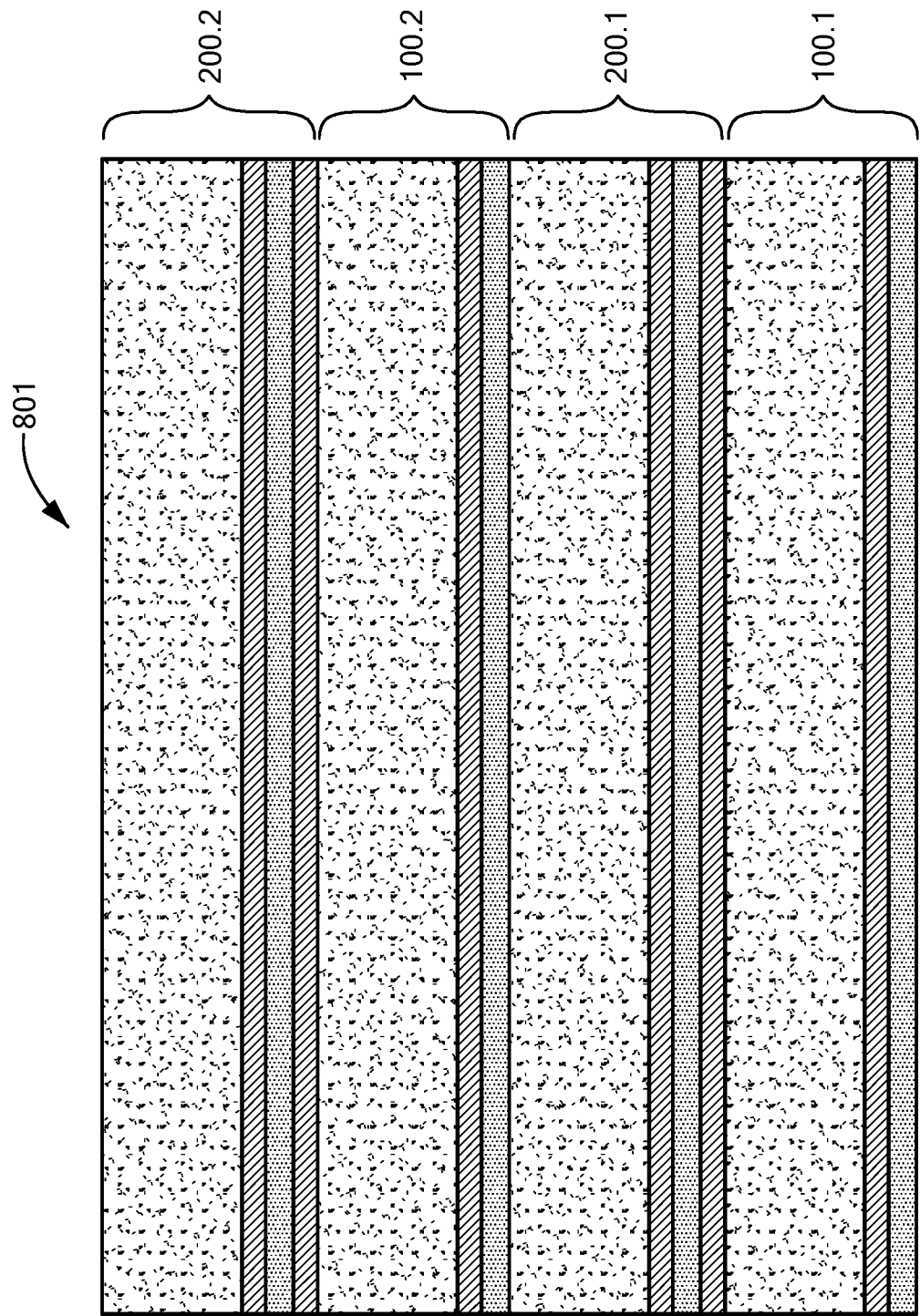

LAYERED SENSOR APPARATUS AND METHOD OF MAKING SAME

CROSS REFERENCE TO RELATED APPLICATIONS

This application claims the benefit of U.S. Provisional Application Ser. No. 62/465,239, filed Mar. 1, 2017, which is incorporated herein by reference in its entirety.

BACKGROUND OF THE INVENTION

The present disclosure relates generally to a sensing apparatus, particularly to a layered sensor, and more particularly to a layered foam sensor.

Soft flexible sensors are useful in a growing number of applications such as IoT (internet of things) devices, wearable objects (such as helmets for example), apparel, and medical devices, to name a few. Existing conformable sensors include packaged ceramics and polyvinylidene fluoride (PVDF)-based materials. An example flexible capacitive sensor is described in U.S. Pat. No. 7,301,351. An example elastomeric composite material productive of a piezoelectric response and useful in a strain gauge measuring application is described in U.S. Pat. No. 8,984,954. An example triboelectric generator is described in U.S. Pat. No. 9,178,446. While existing materials and sensors made from such materials may be suitable for their intended purpose, the art relating to soft flexible sensors would be advanced with a soft flexible sensor that provides dual sensing with linear sensing characteristics.

This background information is provided to reveal information believed by the applicant to be of possible relevance to the present invention. No admission is necessarily intended, nor should be construed, that any of the preceding information constitutes prior art against the present invention.

BRIEF DESCRIPTION OF THE INVENTION

In an embodiment, a sensor apparatus includes a first of a plurality of layers having a top layer, a bottom layer, and at least one intermediate layer, the at least one intermediate layer having an electrical conductor layer, each of the top layer, the bottom layer, and the at least one intermediate layer disposed in direct contact with a respective adjacent layer. A second of the plurality of layers is disposed in direct contact with the first plurality of layers such that the bottom layer of the second plurality of layers is disposed in direct contact with the top layer of the first plurality of layers. The first and second plurality of layers are productive of a piezoelectric voltage absent of an external current producing device and in response to being deformed, and the first and second plurality of layers are productive of a change in capacitance in response to being deformed.

In an embodiment, a method of making the foregoing sensor apparatus includes: applying an elastomer foam A-layer atop a metal-coated substrate comprising an elastomer B-layer to form a layered construct with the metal-coated portion of the metal-coated substrate disposed between the elastomer foam A-layer and the elastomer B-layer, the elastomer foam A-layer having a first rating on a triboelectric series, the elastomer B-layer having a second rating on a triboelectric series; applying a second of the metal-coated substrate atop the layered construct, and applying a second of the elastomer foam A-layer atop the metal-coated portion of the second metal-coated substrate to form a plurality of the layered construct; and curing the plurality of the layered construct.

In an embodiment, another method of making the foregoing sensor apparatus includes: applying an elastomer foam A-layer atop a metal-coated substrate comprising an elastomer B-layer to form a layered construct with the metal-coated portion of the metal-coated substrate disposed between the elastomer foam A-layer and the elastomer B-layer, the elastomer foam A-layer having a first rating on a triboelectric series, the elastomer B-layer having a second rating on a triboelectric series; curing the layered construct to form a cured layered construct and to provide a first of the cured layered construct; and attaching a second of the cured layered construct atop the first cured layered construct, the first and second cured layered constructs having identically ordered layers.

The above features and advantages and other features and advantages of the invention are readily apparent from the following detailed description of the invention when taken in connection with the accompanying drawings.

BRIEF DESCRIPTION OF THE DRAWINGS

Referring to the exemplary non-limiting drawings wherein like elements are numbered alike in the accompanying Figures:

FIG. 8 depicts a plurality of layered constructs 801 similar to those depicted in FIGS. 2, 4, 6 and 7, but having a first layered construct as depicted in FIG. 1 in an alternating arrangement with a second layered construct as depicted in FIG. 2, in accordance with an embodiment.

DETAILED DESCRIPTION OF THE INVENTION

Although the following detailed description contains many specifics for the purposes of illustration, anyone of ordinary skill in the art will appreciate that many variations and alterations to the following details are within the scope of the claims. Accordingly, the following example embodiments are set forth without any loss of generality to, and without imposing limitations upon, the claimed invention.

An embodiment, as shown and described by the various figures and accompanying text, provides a layered foam sensing apparatus having two modes of sensing; a piezoelectric mode of sensing, and a capacitive mode of sensing. The piezoelectric mode of sensing (i.e., piezoelectric sensor) is accomplished via a triboelectric effect between adjacent layers of a metal and an elastomer, and the capacitive mode of sensing (i.e., capacitive sensor) is accomplished via a parallel plate capacitor that utilizes the same metal layers and elastomer layer of the piezoelectric sensor. While embodiments described and illustrated herein depict a certain number of layered constructs as an example layered foam sensing apparatus, it will be appreciated that the disclosed invention is not so limited and encompasses any number of layered constructs suitable for a purpose disclosed herein.

Figure 1:
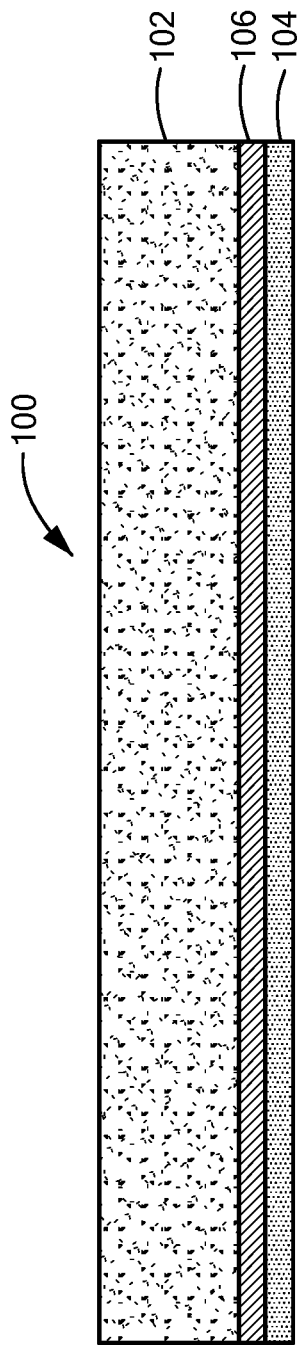
FIG. 1 depicts in cross section side view a layered construct in accordance with an embodiment.

FIG. 1 depicts an embodiment of a layered construct 100 having a plurality of layers, such as a top layer 102, a bottom layer 104, and at least one intermediate layer 106. In the embodiment depicted in FIG. 1 a layer of the at least one intermediate layer 106 is an electrical conductor layer. Each of the top layer 102, the bottom layer 104, and the electrical conductor layer 106 is disposed in direct intimate contact with a respective adjacent layer. As used herein, the phrase in direct intimate contact means in direct physical contact with some degree of physical bonding at the respective interface so that the resulting construct is capable of performing in a manner described herein.

Figure 2:
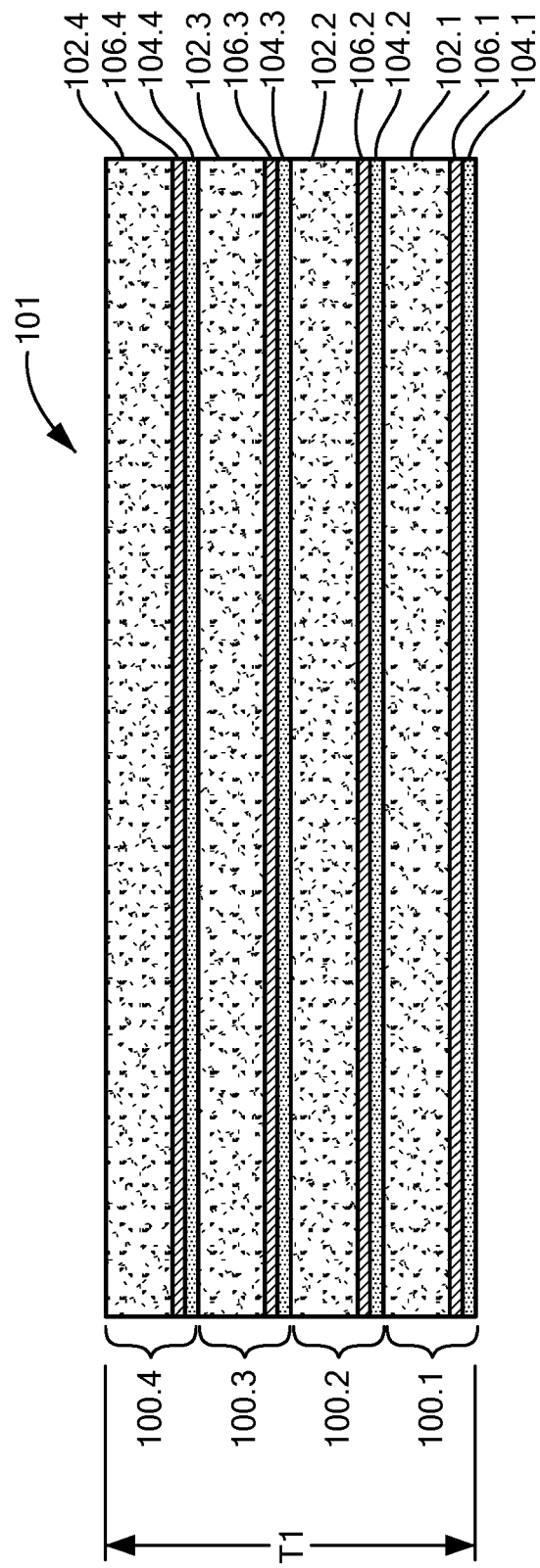
FIG. 2 depicts in cross section side view a plurality of the layered constructs of FIG. 1 in accordance with an embodiment.

FIG. 2 depicts four of the layered constructs 100 depicted in FIG. 1, which are herein denoted by reference numerals 100.1, 100.2, 100.3 and 100.4 and collectively referred to by reference numeral 101, with each layered construct 100.1, 100.2, 100.3, 100.4 having the same order and arrangement of layers 102, 106 and 104, in order, top-down, as that of layered construct 100 depicted in FIG. 1. That is, a second layered construct 100.2 is disposed in direct intimate contact with a first layered construct 100.1 such that the bottom layer 104.2 of the second layered construct 100.2 is disposed in direct intimate contact with the top layer 102.1 of the first layered construct 100.1. The same order and arrangement of layers 102, 106 and 104 is repeated for the third layered construct 100.3 relative to the second layered construct 100.2, and for the fourth layered construct 100.4 relative to the third layered construct 100.3. While the number of layered constructs 100 depicted in FIG. 1 is one, and in FIG. 2 is four, it will be appreciated the scope of the invention is not so limited and encompasses any number of layered constructions suitable for a purpose disclosed herein. That is, the plurality of layered constructs 101 depicted in FIG. 2 is representative of two, three, four or more layered constructs 100 arranged in a manner disclosed herein.

In the embodiments depicted in FIGS. 1 and 2, the top layer 102 of a given layered construct 100 is a first elastomer foam layer having a first rating on a triboelectric series, and the bottom layer 104 of the given layered construct 100 is a second elastomer layer having a second rating on a triboelectric series. By utilizing elastomer layers 102, 104 that sandwich an intermediate electrical conductor layer 106, and by utilizing at least two layered constructs 100.1, 100.2 in an ordered arrangement one on top of the other as depicted in FIG. 2, the two layered constructs are productive of a piezoelectric voltage absent of an external current producing device and in response to being deformed in a manner described herein below, and are productive of a change in capacitance in response to being deformed in a manner described herein below. In an embodiment, the first and second elastomer layers 102, 104 have a triboelectric series rating sufficient to produce a triboelectric effect suitable for a purpose disclosed herein when layered adjacent a suitable metal as disclosed herein.

In the embodiments depicted in FIGS. 1 and 2, the bottom layer 104 and the intermediate layer 106 may be provided in the form of a single-sided metal-coated substrate, where the substrate is an elastomer, and in an embodiment is polyethylene terephthalate (PET). In the art, the combined form of the bottom layer 104 and the intermediate layer 106 is referred to as a single-sided metal-coated PET film.

Figure 3:
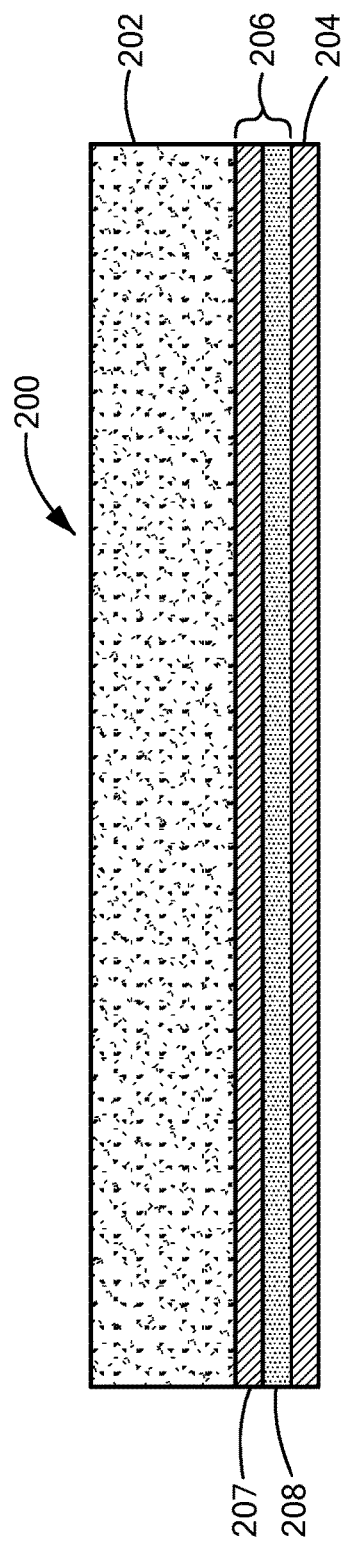
FIG. 3 depicts in cross section side view another layered construct in accordance with an embodiment.
Figure 4:
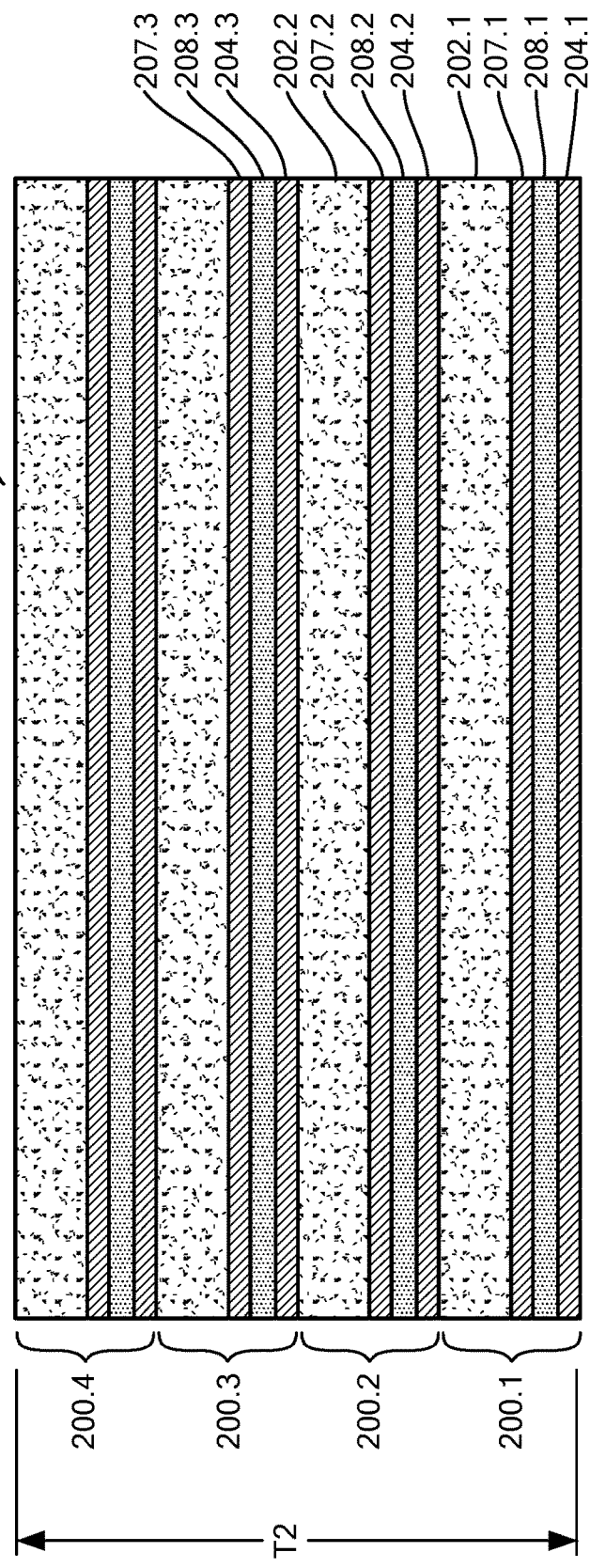
FIG. 4 depicts in cross section side view a plurality of the layered constructs of FIG. 3 in accordance with an embodiment.

Reference is now made to FIGS. 3 and 4, which depict similar embodiments to those depicted in FIGS. 1 and 2, respectively, but with a difference that will now be described.

FIG. 3 depicts another embodiment of a layered construct 200 having a plurality of layers, such as a top layer 202, a bottom layer 204, and at least one intermediate layer 206. In the embodiment depicted in FIG. 3 the top layer 202 is a first elastomer foam layer having a first rating on a triboelectric series, the at least one intermediate layer 206 includes a first electrical conductor layer 207 and a second elastomer layer 208 having a second rating on a triboelectric series, and the bottom layer 204 is a second electrical conductor layer. Each of the top first elastomer foam layer 202, the first electrical conductor layer 207, the second elastomer layer 208, and the bottom second electrical conductor layer 204 are disposed in direct intimate contact with a respective adjacent layer. As depicted, the top first elastomer foam layer 202 and the first electrical conductor layer 207 are disposed in direct intimate contact with each other, the second elastomer layer 208 is disposed in direct intimate contact with the first electrical conductor layer 207 on a side opposite that of the top first elastomer foam layer 202, and the bottom second electrical conductor layer 204 is disposed in direct intimate contact with the second elastomer layer 208 on a side opposite that of the first electrical conductor layer 207. In an embodiment, the first and second elastomer layers 202, 208 have a triboelectric series rating sufficient to produce a triboelectric effect suitable for a purpose disclosed herein when layered adjacent a suitable metal as disclosed herein.

FIG. 4 depicts four of the layered constructs 200 depicted in FIG. 3, which are herein denoted by reference numerals 200.1, 200.2, 200.3 and 200.4 and collectively referred to by reference numeral 201, with each layered construct 200.1, 200.2, 200.3, 200.4 having the same order and arrangement of layers 202, 207, 208 and 204, in order, top-down, as that of layered construct 200 depicted in FIG. 3. That is, a second layered construct 200.2 is disposed in direct intimate contact with a first layered construct 200.1 such that the bottom layer 204.2 of the second layered construct 200.2 is disposed in direct intimate contact with the top layer 202.1 of the first layered construct 200.1. The same order and arrangement of layers 202, 207, 208 and 204 is repeated for the third layered construct 200.3 relative to the second layered construct 200.2, and for the fourth layered construct 200.4 relative to the third layered construct 200.3. While the number of layered constructs 200 depicted in FIG. 3 is one, and in FIG. 4 is four, it will be appreciated the scope of the invention is not so limited and encompasses any number of layered constructions suitable for a purpose disclosed herein. For example, the plurality of layered constructs 201 depicted in FIG. 4 is representative of two, three, four or more layered constructs 200 arranged in a manner disclosed herein.

Similar to the embodiments depicted in FIGS. 1 and 2, in the embodiments depicted in FIGS. 3 and 4, the top layer 202 of a given layered construct 200 is a first elastomer foam layer having a first rating on a triboelectric series, and the second elastomer layer 208 of the given layered construct 200 has a second rating on a triboelectric series. Different to the embodiments depicted in FIGS. 1 and 2, in the embodiments depicted in FIGS. 3 and 4, the bottom layer 204 is a second electrical conductor layer. By utilizing elastomer layers 202, 208 that sandwich an intermediate first electrical conductor layer 207, and by utilizing a second electrical conductor layer 204 disposed in direct intimate contact with the second elastomer layer 208 on a side opposite that of the first electrical conductor layer 207, a single layered construct 200 is productive of a piezoelectric voltage absent of an external current producing device and in response to being deformed in a manner described herein below, and is productive of a change in capacitance in response to being deformed in a manner described herein below. By utilizing two or more layered constructs 200, as depicted in FIG. 4, in an ordered arrangement one on top of the other, the two or more layered constructs are also productive of a piezoelectric voltage absent of an external current producing device and in response to being deformed, and a change in capacitance in response to being deformed. Depending on the number of layered constructs 200 employed, different voltage and capacitive signal values will be obtained following a deformation, which will be discussed further below.

In the embodiments depicted in FIGS. 3 and 4, the bottom electrical conductor layer 204 and the at least one intermediate layer 206 (the second elastomer layer 208 and the first electrical conductor layer 207) may be provided in the form of a double-sided metal-coated substrate, where in an embodiment the substrate (the second elastomer layer 208) is PET. In the art, the combined form of layers 204, 208 and 207 is referred to as a double-sided metal-coated PET film.

In an embodiment, the top layer 102, 202 of layered constructs 100, 200, respectively, is a first elastomer foam layer that is an unfilled polyurethane. In an embodiment, the unfilled polyurethane is a polyurethane foam having a density of equal to or greater than 9 pounds per cubic foot and equal to or less than 25 pounds per cubic foot. In another embodiment, the first elastomer foam layer may be a silicone-based foam, a latex-based foam, or an olefin-based foam.

In an embodiment, the bottom layer 104 of layered construct 100, and the second elastomer layer 208 of the at least one intermediate layer 206 of layered construct 200, is an elastomer, for example a polyester such as PET, a poly PET film, polypropylene, polyethylene, polyamide, polyimide, or thermoplastic polyurethane (TPU).

In an embodiment, the electrical conductor layer 106 of layered construct 100, and the electrical conductor layers 207, 204 of layered construct 200, are made of at least one of nickel, aluminum, silver, copper, or gold, and may be a solid metal thin film, or metal particles embedded in a binder material.

In either embodiment of layered constructs 100 or 200 depicted in FIGS. 1 and 3, or the plurality of layered constructs 101, 201 depicted in FIGS. 2 and 4, the piezoelectric voltage produced in response to the plurality of layers or the plurality of layered constructs being deformed is a triboelectric effect exhibited by the plurality of layers, and more particularly by the relative movement between the respective electrical conductor layers and the associated adjacent elastomer layers.

In an embodiment, a plurality of the layered constructs 101 or 201 as depicted in FIGS. 2 and 4, respectively, have a flexural modulus equal to or less than 1.1 Giga Pascal (GPa), and have an overall thickness T1 or T2, respectively, of equal to or greater than 2 mm and equal to or less than 40 mm. While FIGS. 2 and 4 each depict four layers of layered constructs 100, 200, respectively, it will be appreciated from all that is disclosed herein that the number of layered constructs encompasses a range that is equal to or greater than one layered construct and equal to or less than twenty layered constructs. In an embodiment, the thickness of the first elastomer foam layer 102, 202 is a substantially thicker than the thickness of the second elastomer layer 104, 208, where the thickness ratio may be equal to or greater than 3:1, equal to or greater than 5:1, equal to or greater than 10:1, or even equal to or greater than 25:1. By utilizing a first elastomer foam layer 102, 202 that is a substantially thicker than the second elastomer layer 104, 208, a layered construct is provided 100, 200 with distinct sensing modes, such that the first elastomer foam layer 102, 202 is responsive to impact/pressure and provides a means for impact/pressure sensing, and the second elastomer layer 104, 208 forms part of a thin film capacitor that is responsive to force and provides a means for force sensing.

As noted hereinabove, the plurality of layered constructs 101 depicted in FIG. 2, and the plurality of layered constructs 201 depicted in FIG. 4, are representative of two, three, four or more respective layered constructs 100, 200 arranged in a manner disclosed herein. In an embodiment, the plurality of layered constructs 101 or 201, having two or more respective layered constructs 100, 200, are productive of a first piezoelectric voltage and a first change in capacitance in response to being deformed by a first impact force, a second piezoelectric voltage and a second change in capacitance in response to being deformed by a second impact force, and a third piezoelectric voltage and a third change in capacitance in response to being deformed by a third impact force, where the first, second and third piezoelectric voltages have a linear relationship with the respective first, second and third impact forces, and where the first, second and third changes in capacitance have a linear relationship with the respective first, second and third impact forces.

Figure 5:
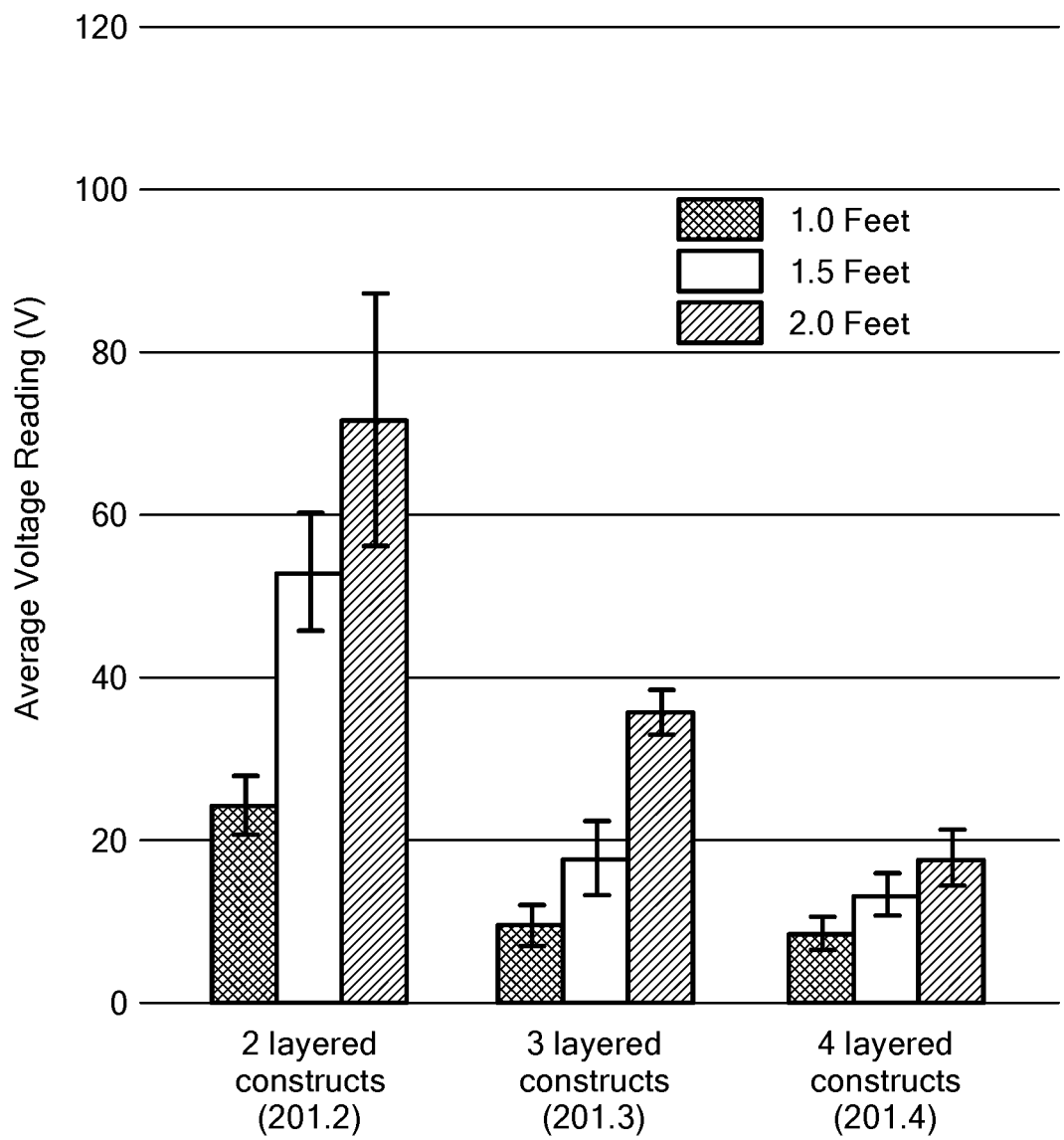
FIG. 5 depicts a chart that compares the piezoelectric output voltage signal of tested embodiments of a plurality of layered constructs similar to the embodiment depicted in FIG. 4, but with an alternate number of layered constructs, in accordance with an embodiment.

FIG. 5 depicts a chart that compares the piezoelectric output voltage signal of tested embodiments of a plurality of layered constructs 201 similar to that depicted in FIG. 4, but which utilizes two layers of layered constructs 200 (see 200.1 and 200.2 in FIG. 4, and 201.2 in FIG. 5), three layers of layered constructs 200 (see 200.1, 200.2 and 200.3 in FIG. 4, and 201.3 in FIG. 5), and four layers of layered constructs 200 (see 200.1, 200.2, 200.3 and 200.4 in FIG. 4, and 201.4 in FIG. 5), where each embodiment of constructs denoted in FIG. 5 by 201.2, 201.3, 201.4 was exposed to an impact force from a free falling 1 kilogram weight from three different heights of 1 foot, 1.5 feet, and 2 feet. In each embodiment tested, the first elastomer layer 202 of each layered construct 200 was an unfilled polyurethane foam having a density of 20 pounds-per-cubic-foot at a thickness of 2 mm. The particular polyurethane foam formulation used for the subject test samples was PORON XRD* manufactured by Rogers Corporation, Connecticut, U.S.A. (where the * designates a trademark owned by Rogers Corporation). In each embodiment tested, the bottom three layers 207, 208 and 204 of each layered construct 200 was a double-sided metal-coated PET film having a thickness of 75 micrometer (μm), manufactured by ROL-VAC, LP, Dayville, Conn., USA. In the embodiment tested, the thickness ratio of the first elastomer foam layer 202 to the double-sided metal-coated PET film was about 26:1. As can be seen by comparing the output voltage signals of each the three constructs 201.2, 201.3, 201.4 for each of the three drop heights, the respective first, second and third piezoelectric voltages have a statistically significant linear relationship with the respective first, second and third drop heights, and therefore for the associated first, second and third impact forces, for each of the three constructs 201.2, 201.3, 201.4. An advantage of such a sensor apparatus provides a hybrid sensor having both linear force sensing via the capacitive sensor, and linear impact sensing via the piezoelectric sensor, in combination.

Figure 6:
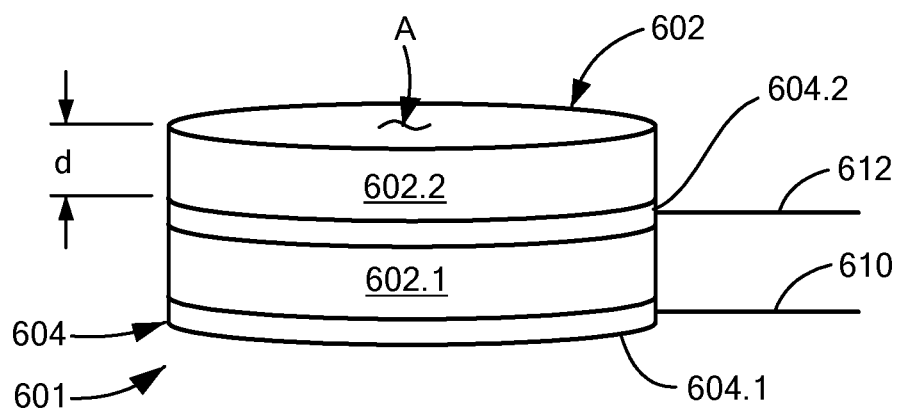
FIG. 6 depicts in perspective view a two-layered arrangement representative of layered constructs depicted in FIG. 2, or alternatively layered constructs as depicted in FIG. 4, in accordance with an embodiment.
Figure 7:
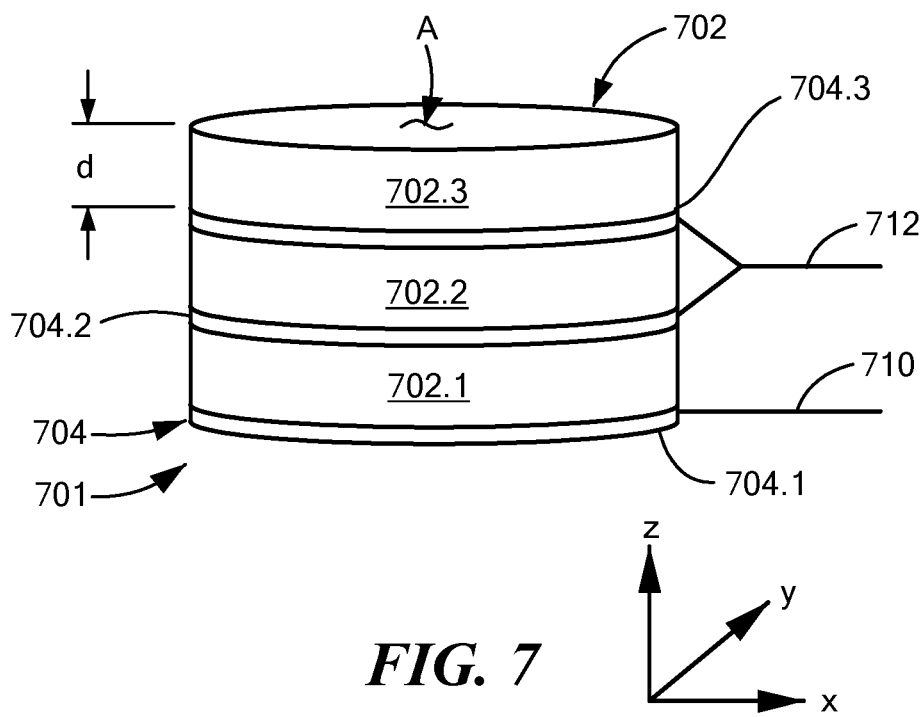
FIG. 7 depicts in perspective view a three-layered arrangement representative of layered constructs depicted in FIG. 2, or alternatively layered constructs as depicted in FIG. 4, in accordance with an embodiment.

Reference is now made to FIGS. 6 and 7, which depict in perspective view representative embodiments of a plurality of layered constructs 601, 701 having two layers and three layers, respectively. The plurality of layered constructs 601, 701 may be formed by repetitive layering of layered constructs 100, or repetitive layering of layered constructs 200, layered in the manner described herein above.

In FIG. 6, the two-layered arrangement is representative of layered constructs 100.1 and 100.2 depicted in FIG. 2 in the event that layered construct 100 is employed, or layered constructs 200.1 and 200.2 depicted in FIG. 4 in the event that layered construct 200 is employed.

In FIG. 7, the three-layered arrangement is representative of layered constructs 100.1, 100.2 and 100.3 depicted in FIG. 2 in the event that layered construct 100 is employed, or layered constructs 200.1, 200.2 and 200.3 depicted in FIG. 4 in the event that layered construct 200 is employed.

In the two-layered arrangement depicted in FIG. 6, portions 602 (separately denoted as 602.1 and 602.2) represent either the elastomer layer 102 depicted in FIG. 1, or the elastomer layer 202 depicted in FIG. 3, and portions 604 (separately denoted as 604.1 and 604.2) represent either the remaining plurality of layers 104, 106 in FIG. 1, or the remaining plurality of layers 204, 206 in FIG. 3, depending on which layered construct 100 or 200 is employed. In the event that layered construct 100 is employed, the electrical signal lines 610 and 612 are electrically connected to respective ones of the electrical conductor layers 106.1 and 106.2 (depicted in FIG. 2), and in the event that layered construct 200 is employed, the electrical signal line 610 is electrically connected in parallel to electrical conductor layers 204.1 and 207.1 (depicted in FIG. 4), and electrical signal line 612 is electrically connected in parallel to electrical conductor layers 204.2 and 207.2 (depicted in FIG. 4).

Similarly, the three-layered arrangement depicted in FIG. 7, portions 702 (separately denoted as 702.1, 702.2 and 702.3) represent either the elastomer layer 102 depicted in FIG. 1, or the elastomer layer 202 depicted in FIG. 3, and portions 704 (separately denoted as 704.1, 704.2 and 704.3) represent either the remaining plurality of layers 104, 106 in FIG. 1, or the remaining plurality of layers 204, 206 in FIG. 3, depending on which layered construct 100 or 200 is employed. In the event that layered construct 100 is employed, the electrical signal line 710 is electrically connected to electrical conductor layer 106.1 (depicted in FIG. 2), and the electrical signal line 712 is electrically connected in parallel to electrical conductor layers 106.2 and 106.3 (depicted in FIG. 2). In the event that layered construct 200 is employed, the electrical signal line 710 is electrically connected in parallel to electrical conductor layers 204.1 and 207.1 (depicted in FIG. 4), and the electrical signal line 712 is electrically connected in parallel to electrical conductor layers 204.2, 207.2, 204.3 and 207.3 (depicted in FIG. 4).

In the embodiments depicted in FIGS. 6 and 7, the plurality of layered constructs 601, 701 are depicted being cylindrical in shape with a circular cross section "A" relative to the z-axis, and each first elastomer layer 602 or 702 (or 102, 202 in the embodiments depicted in FIGS. 1-4) having a height "d". However, the scope of the invention is not so limited and encompasses any three dimensional shape and size suitable for a purpose disclosed herein.

With either embodiment of layered construct 100 depicted in FIG. 1 or layered construct 200 depicted in FIG. 3, and arranged and structured as depicted in FIG. 6 or 7, the capacitive sensor is provided by a change in capacitance C given by $C = c*A/d$, where C is the capacitance in Farads of the respective plurality of layered constructs 601, 701, c is the permittivity of the respective first elastomer layer 602, 702, A is the cross sectional area of the respective first elastomer layer 602, 702 (for discussion purposes it is assumed that this cross sectional area A defines the area of overlap with the respective adjacent electrical conductor layers), and d is the height of the respective first elastomer layer 602, 702 (for discussion purposes it is assumed that this height h defines the distance between the respective adjacent electrical conductor layers). Whether the plurality of layered constructs 601, 701 undergo strain in the x-y plane or deformation along the z-axis, a measurable change in capacitance will occur that can be sensed by the respective electrical signal lines 610, 612 or 710, 712. As discussed herein above, the resulting apparatus (i.e., the plurality of layered constructs 601, 701) provides a hybrid sensor having both linear force sensing via the capacitive sensor, and linear impact sensing via the piezoelectric sensor, in combination, where the sensed signals for both the capacitive sensor and the piezoelectric sensor are sensed via respective signal lines 601, 612 or 710, 712.

While embodiments of the invention have been described and illustrated herein having a plurality of layered constructs 101 utilizing the same individual ones of layered construct 100, or having a plurality of layered constructs 201 utilizing the same individual ones of layered construct 200, shaped and arranged as depicted in FIGS. 2, 4, 6 and 7, it will be appreciated that the scope of the invention is not so limited and also encompasses an arrangement of a plurality of layered constructs that utilizes both layered construct 100 (i.e., a single-metal-layered PET for example) and layered construct 200 (i.e., a double-metal-layered PET for example), which will now be described with reference to depicted in FIG. 8.

FIG. 8 depicts a plurality of layered constructs 801 similar to those depicted in FIGS. 2, 4, 6 and 7, but having a first layered construct 100.1 (layered construct 100 in FIG. 1) at the bottom, a second layered construct 200.1 (layered construct 200 in FIG. 3) disposed directly and intimately on top of the first layered construct 100.1, a third layered construct 100.2 (layered construct 100 in FIG. 1) disposed directly and intimately on top of the second layered 200.1, and a fourth layered construct 200.2 (layered construct 200 in FIG. 3) disposed directly and intimately on top of the third layered construct 100.2. Any and all combinations of layering the layered constructs 100 and 200 in any arranged order are contemplated herein and are considered to be within the scope of the invention disclosed herein.

With consideration to the foregoing, it will be appreciated that a sensor apparatus according to any of the foregoing structures may be made by a variety of methods. A few of such methods will now be described.

In an embodiment, a method of making a sensor apparatus as herein described includes: applying an elastomer foam A-layer atop a metal-coated substrate comprising an elastomer B-layer to form a layered construct with the metal-coated portion of the metal-coated substrate disposed between the elastomer foam A-layer and the elastomer B-layer, the elastomer foam A-layer having a first rating on a triboelectric series, the elastomer B-layer having a second rating on a triboelectric series; applying a second of the metal-coated substrate atop the layered construct, and applying a second of the elastomer foam A-layer atop the metal-coated portion of the second metal-coated substrate to form a plurality of the layered construct; and curing the plurality of the layered construct.

In an embodiment of the method, the applied elastomer foam A-layer is an uncured polyurethane foam, and in an embodiment is an unfilled, uncured polyurethane foam, each of which is subsequently cured after applying.

In an embodiment of the method, the elastomer B-layer is a PET film.

In an embodiment of the method, the metal-coated substrate is a single-sided metal-coated substrate, such as a single-sided metal-coated PET thin film for example.

In an embodiment of the method, the metal-coated substrate is a double-sided metal-coated substrate having a first metal-coated portion on one side of the elastomer B-layer and a second metal-coated portion on an opposing side of the elastomer B-layer, the first metal-coated portion being the metal-coated portion disposed between the elastomer foam A-layer and the elastomer B-layer; the applying a second of the metal-coated substrate includes applying a second of the double-sided metal-coated substrate atop the layered construct; and the applying a second of the elastomer foam A-layer includes applying a second of the elastomer foam A-layer atop the first metal-coated portion of the second double-sided metal-coated substrate.

In an embodiment of the method, the metal-coated substrate is a double-sided metal-coated substrate, such as a double-sided metal-coated PET thin film for example.

In an embodiment of the method, the applying an elastomer foam A-layer comprises a roll coating process, such as but not limited to a knife-over-roll coating process, a plate-over-roll coating process, a gravure coating process, a reverse roll coating process, a metering rod coating process, a slot die coating process, an immersion coating process, a curtain coating process, an air knife coating process, or any other roll coating process suitable for a purpose disclosed herein.

In another embodiment, a second method of making a sensor apparatus as herein described includes: applying an elastomer foam A-layer atop a metal-coated substrate comprising an elastomer B-layer to form a layered construct with the metal-coated portion of the metal-coated substrate disposed between the elastomer foam A-layer and the elastomer B-layer, the elastomer foam A-layer having a first rating on a triboelectric series, the elastomer B-layer having a second rating on a triboelectric series; curing the layered construct to form a cured layered construct and to provide a first of the cured layered construct; and attaching a second of the cured layered construct atop the first cured layered construct, the first and second cured layered constructs having identically ordered layers.

In an embodiment of the second method, the applied elastomer foam A-layer is an uncured polyurethane foam, and in an embodiment is an unfilled, uncured polyurethane foam.

In an embodiment of the second method, the elastomer B-layer is a PET film.

In an embodiment of the second method, the metal-coated substrate is a single-sided metal-coated substrate, such as a single-sided metal-coated PET thin film for example.

In an embodiment of the second method, the metal-coated substrate is a double-sided metal-coated substrate having a first metal-coated portion on one side of the elastomer B-layer and a second metal-coated portion on an opposing side of the elastomer B-layer, the first metal-coated portion being the metal-coated portion disposed between the elastomer foam A-layer and the elastomer B-layer.

In an embodiment of the second method, the attaching includes one of chemical bonding, mechanical bonding, or vibratory bonding, or a combination of the foregoing types of bonding.

For any of the embodiments disclosed herein, an example unfilled polyurethane foam suitable for a purpose disclosed herein is PORON XRD*, available from Rogers Corporation, Connecticut, U.S.A. (where the * designates a trademark owned by Rogers Corporation).

For any of the embodiments disclosed herein, PET thin films, single-sided metal-coated or double-sided metal-coated, suitable for a purpose disclosed herein include commercially available PET thin films.

While the invention has been described herein with reference to a first elastomer layer 102, 202 and a second elastomer layer 104, 208, with example materials for such layers being different elastomers, or one being foam and the other not being foam, it is contemplated that the two elastomer layers could be made from the same material, as long as one of the layers serves to provide a means for impact/pressure sensing, and the other of the layers serves to provide a means for force sensing.

While the invention has been described with reference to exemplary embodiments, it will be understood by those skilled in the art that various changes may be made and equivalents may be substituted for elements thereof without departing from the scope of the claims. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments and, although specific terms and/or dimensions may have been employed, they are unless otherwise stated used in a generic, exemplary and/or descriptive sense only and not for purposes of limitation, the scope of the claims therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item. Additionally, the term "comprising" as used herein does not exclude the possible inclusion of one or more additional features.

The invention claimed is:

1. A sensor apparatus, comprising:
 a first of a plurality of layers comprising a top layer, a bottom layer, and at least one intermediate layer, the at least one intermediate layer comprising an electrical conductor layer, each of the top layer, the bottom layer, and the at least one intermediate layer is disposed in direct intimate contact with a respective adjacent layer, wherein direct intimate contact includes a physical bond at the respective interface;
 a second of the plurality of layers disposed in direct intimate contact with the first plurality of layers such that the bottom layer of the second plurality of layers is disposed in direct contact with the top layer of the first plurality of layers;

the first and second plurality of layers configured to produce productive of a piezoelectric voltage absent of an external current producing device and in response to being deformed; and
the first and second plurality of layers configured to produce productive of a change in capacitance in response to being deformed.

2. The sensor apparatus of claim 1, wherein:
the top layer of the plurality of layers is a single layer of a first elastomer foam layer having a first rating on a triboelectric series; and
the bottom layer of the plurality of layers is a single layer of a second elastomer layer having a second rating on a triboelectric series.

3. The sensor apparatus of claim 1, wherein:
the top layer of the plurality of layers is a single layer of a first elastomer foam layer having a first rating on a triboelectric series;
the electrical conductor layer of the at least one intermediate layer is a first electrical conductor layer disposed in direct intimate contact with the top layer;
the at least one intermediate layer further comprises a second elastomer layer having a second rating on a triboelectric series, the second elastomer layer disposed in direct intimate contact with the first electrical conductor layer on a side opposite that of the top layer; and
the bottom layer is a single layer of a second electrical conductor layer disposed in direct intimate contact with the second elastomer layer on a side opposite that of the first electrical conductor layer.

4. The sensor apparatus of claim 1, wherein:
the first and second plurality of layers are configured to produce a first piezoelectric voltage in response to being deformed by a first impact force, a second piezoelectric voltage in response to being deformed by a second impact force, and a third piezoelectric voltage in response to being deformed by a third impact force;
the first, second and third piezoelectric voltages having a linear relationship with the respective first, second and third impact forces.

5. The sensor apparatus of claim 2, wherein:
the first elastomer foam layer is unfilled polyurethane.

6. The sensor apparatus of claim 5, wherein:
the unfilled polyurethane is a polyurethane foam having a density of equal to or greater than 9 pounds per cubic foot and equal to or less than 25 pounds per cubic foot.

7. The sensor apparatus of claim 2, wherein:
the second elastomer layer is a polyethylene terephthalate (PET) film.

8. The sensor apparatus of claim 1, wherein:
the electrical conductor layer material comprises at least one of: nickel, aluminum or silver.

9. The sensor apparatus of claim 3, wherein:
the first electrical conductor layer material and the second electrical conductor layer material comprises at least one of: nickel, aluminum or silver.

10. The sensor apparatus of claim 1, further comprising:
a third or more of the plurality of layers disposed in direct intimate contact with each other to form a repetitive ordered layered construct;
the layered construct configured to produce a first piezoelectric voltage in response to being deformed by a first impact force, a second piezoelectric voltage in response to being deformed by a second impact force, and a third piezoelectric voltage in response to being deformed by a third impact force;
the first, second and third piezoelectric voltages having a linear relationship with the respective first, second and third impact forces.

11. The sensor apparatus of claim 1, wherein:
the piezoelectric voltage produced in response to the plurality of layers being deformed is a triboelectric effect exhibited by the plurality of layers.

12. The sensor apparatus of claim 1, wherein the plurality of layers has a flexural modulus equal to or less than 1.1 GPa (Giga Pascal).

13. The sensor apparatus of claim 1, wherein the plurality of layers has an overall thickness of equal to or greater than 2 mm and equal to or less than 40 mm.

14. The sensor apparatus of claim 1, wherein:
the first and second of the plurality of layers have identically ordered layers.

15. A method of making the sensor apparatus of claim 1, comprising:
applying an elastomer foam A-layer atop a metal-coated substrate comprising an elastomer B-layer to form a layered construct with the metal-coated portion of the metal-coated substrate disposed between the elastomer foam A-layer and the elastomer B-layer, the elastomer foam A-layer having a first rating on a triboelectric series, the elastomer B-layer having a second rating on a triboelectric series;
applying a second of the metal-coated substrate atop the layered construct, and applying a second of the elastomer foam A-layer atop the metal-coated portion of the second metal-coated substrate to form a plurality of the layered construct; and
curing the plurality of the layered construct.

16. The method of claim 15, wherein:
the metal-coated substrate is a double-sided metal-coated substrate having a first metal-coated portion on one side of the elastomer B-layer and a second metal-coated portion on an opposing side of the elastomer B-layer, the first metal-coated portion being the metal-coated portion disposed between the elastomer foam A-layer and the elastomer B-layer;
the applying a second of the metal-coated substrate comprises applying a second of the double-sided metal-coated substrate atop the layered construct; and
the applying a second of the elastomer foam A-layer comprises applying a second of the elastomer foam A-layer atop the first metal-coated portion of the second double-sided metal-coated substrate.

17. The method of claim 15, wherein the applied elastomer foam A-layer is an uncured polyurethane foam.

18. The method of claim 15, wherein the elastomer B-layer is a polyethylene terephthalate (PET) film.

19. The method of claim 14, wherein the applying an elastomer foam A-layer comprises a roll coating process.

20. A method of making the sensor apparatus of claim 1, comprising:
applying an elastomer foam A-layer atop a metal-coated substrate comprising an elastomer B-layer to form a layered construct with the metal-coated portion of the metal-coated substrate disposed between the elastomer foam A-layer and the elastomer B-layer, the elastomer foam A-layer having a first rating on a triboelectric series, the elastomer B-layer having a second rating on a triboelectric series;
curing the layered construct to form a cured layered construct and to provide a first of the cured layered construct; and attaching a second of the cured layered construct atop the first cured layered construct, the first and second cured layered constructs having identically ordered layers.

21. The method of claim 20, wherein:
the metal-coated substrate is a double-sided metal-coated substrate having a first metal-coated portion on one side of the elastomer B-layer and a second metal-coated portion on an opposing side of the elastomer B-layer, the first metal-coated portion being the metal-coated portion disposed between the elastomer foam A-layer and the elastomer B-layer.

22. The method of claim 20, wherein:
the attaching comprises chemical bonding, mechanical bonding, or vibratory bonding.

23. The sensor apparatus of claim 1, wherein:
at least one of the top layer or the bottom layer of the plurality of layers is an elastomer layer.

24. The sensor apparatus of claim 1, wherein:
the piezoelectric voltage is produced by relative movement between a respective one of the electrical conductor layer and an associated adjacent one of the elastomer layer.

\* \* \* \* \*